(12) United States Patent
Taguchi

(10) Patent No.: US 10,411,638 B2
(45) Date of Patent: Sep. 10, 2019

(54) SEMICONDUCTOR INTEGRATED CIRCUIT

(71) Applicant: Kabushiki Kaisha Toshiba, Minato-ku, Tokyo (JP)

(72) Inventor: Kazuhiro Taguchi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 15/216,854

(22) Filed: Jul. 22, 2016

(65) Prior Publication Data
US 2017/0033555 A1 Feb. 2, 2017

(30) Foreign Application Priority Data

Jul. 28, 2015 (JP) .................. 2015-148367

(51) Int. Cl.
*H02H 9/08* (2006.01)
*H02P 29/024* (2016.01)
*H03K 17/081* (2006.01)

(52) U.S. Cl.
CPC ........ *H02P 29/024* (2013.01); *H02P 29/0241* (2016.02); *H03K 17/08104* (2013.01)

(58) Field of Classification Search
USPC ....................................... 361/93.9
See application file for complete search history.

(56) References Cited

U.S. PATENT DOCUMENTS

| 5,583,457 | A | 12/1996 | Horiguchi et al. |
| 5,614,847 | A | 3/1997 | Kawahara et al. |
| 5,828,235 | A | 10/1998 | Horiguchi et al. |
| 5,880,604 | A | 3/1999 | Kawahara et al. |
| 6,046,604 | A | 4/2000 | Horiguchi et al. |
| 6,107,836 | A | 8/2000 | Kawahara et al. |
| 6,175,251 | B1 | 1/2001 | Horiguchi et al. |
| 6,222,403 | B1 | 4/2001 | Mitsuda |
| 6,281,711 | B1 | 8/2001 | Horiguchi et al. |
| 6,356,119 | B2 | 3/2002 | Horiguchi et al. |
| 6,404,239 | B1 | 6/2002 | Kawahara et al. |

(Continued)

FOREIGN PATENT DOCUMENTS

| JP | 04-117716 A | 4/1992 |
| JP | 06-237164 A | 8/1994 |

(Continued)

OTHER PUBLICATIONS

Additional (more easily readable) Machine translation of JP 2012-129971 A.*

(Continued)

*Primary Examiner* — Ronald W Leja
(74) *Attorney, Agent, or Firm* — White & Case LLP

(57) ABSTRACT

A semiconductor integrated circuit according to an embodiment includes: an output circuit configured to cause a current to flow out from an output terminal to a control target or cause a current to flow in from the control target via the output terminal, based on a control signal; a current source portion provided for the output circuit and configured to be capable of switching a current suppliable to the output terminal; and an adjustment circuit configured to switch a current that the current source portion is caused to generate, based on the control signal.

16 Claims, 8 Drawing Sheets

(56) References Cited

U.S. PATENT DOCUMENTS

| | | | |
|---|---|---|---|
| 6,504,402 B2 | 1/2003 | Horiguchi et al. | |
| 6,696,865 B2 | 2/2004 | Horiguchi et al. | |
| 6,970,019 B2 | 11/2005 | Horiguchi et al. | |
| 7,312,640 B2 | 12/2007 | Horiguchi et al. | |
| 7,359,171 B2 | 4/2008 | Yoshida | |
| 7,750,668 B2 | 7/2010 | Horiguchi et al. | |
| 2001/0010458 A1* | 8/2001 | Ohshima | H03K 17/0822 323/282 |
| 2007/0040542 A1* | 2/2007 | Cortigiani | H03K 17/0822 323/312 |
| 2016/0142048 A1* | 5/2016 | Zoels | H02M 1/08 327/109 |
| 2017/0033555 A1* | 2/2017 | Taguchi | H02H 9/025 |

FOREIGN PATENT DOCUMENTS

| | | | |
|---|---|---|---|
| JP | 07-086916 A | 3/1995 | |
| JP | H11-346147 A | 12/1999 | |
| JP | 3175989 B2 | 6/2001 | |
| JP | 2003-110413 A | 4/2003 | |
| JP | 2003-283314 A | 10/2003 | |
| JP | 2004-080346 A | 3/2004 | |
| JP | 2008-028446 A | 2/2008 | |
| JP | 2008-053782 A | 3/2008 | |
| JP | 2012-129971 A | 7/2012 | |
| JP | 2012-227877 A | 11/2012 | |

OTHER PUBLICATIONS

Japanese Office Action dated May 15, 2018 in counterpart Japanese Application No. 2015-148367, along with English translation.

Japanese Office Action dated Jun. 11, 2019 in corresponding Japanese Patent Application No. 2015-148367, along with English translation.

* cited by examiner

SEMICONDUCTOR INTEGRATED CIRCUIT

CROSS-REFERENCE TO RELATED APPLICATION

This application is based upon and claims the benefit of priority from the prior Japanese Patent Application No. 2015-148367, filed on Jul. 28, 2015; the entire contents of which are incorporated herein by reference.

FIELD

Embodiments described herein relate generally to a semiconductor integrated circuit.

BACKGROUND

Conventionally, in a case of driving a motor or the like by an FET (field effect transistor) circuit, a pre-driver is used to supply a relatively large current to the FET. The pre-driver is often configured as an IC, and it supplies a current to a gate of the FET, which is an external part, to drive the FET.

In general, various protection functions in consideration of a fault and the like are provided for a whole system including the pre-driver and drivers such as an FET driving circuit. For example, in a case of a system in which a motor is driven by the FET driving circuit, control such as turning off a power source is performed by a microcomputer or the like to take safety measures when an output current of the FET is abnormal.

However, protection functions for the IC itself which constitutes the pre-driver are not provided. It is necessary to cause a large current of about several amperes to flow to an MOS transistor constituting the pre-driver in order to improve response performance of a driver. Therefore, there is a problem that there is a possibility that, if a fault of driving parts, various faults such as a sky fault and a ground fault of an IC terminal or the like occur, the pre-driver is destroyed, or other functions are adversely influenced.

DETAILED DESCRIPTION

Semiconductor integrated circuits of embodiments are provided with: an output circuit configured to cause a current to flow out from an output terminal to a control target or cause a current to flow in from the control target via the output terminal, based on a control signal; a current source portion provided for the output circuit and configured to be capable of switching a current suppliable to the output terminal; and an adjustment circuit configured to switch a current which the current source portion is caused to generate, based on the central signal.

Embodiments of the present invention will be described below in detail with reference to drawings.

First Embodiment

Figure 1:
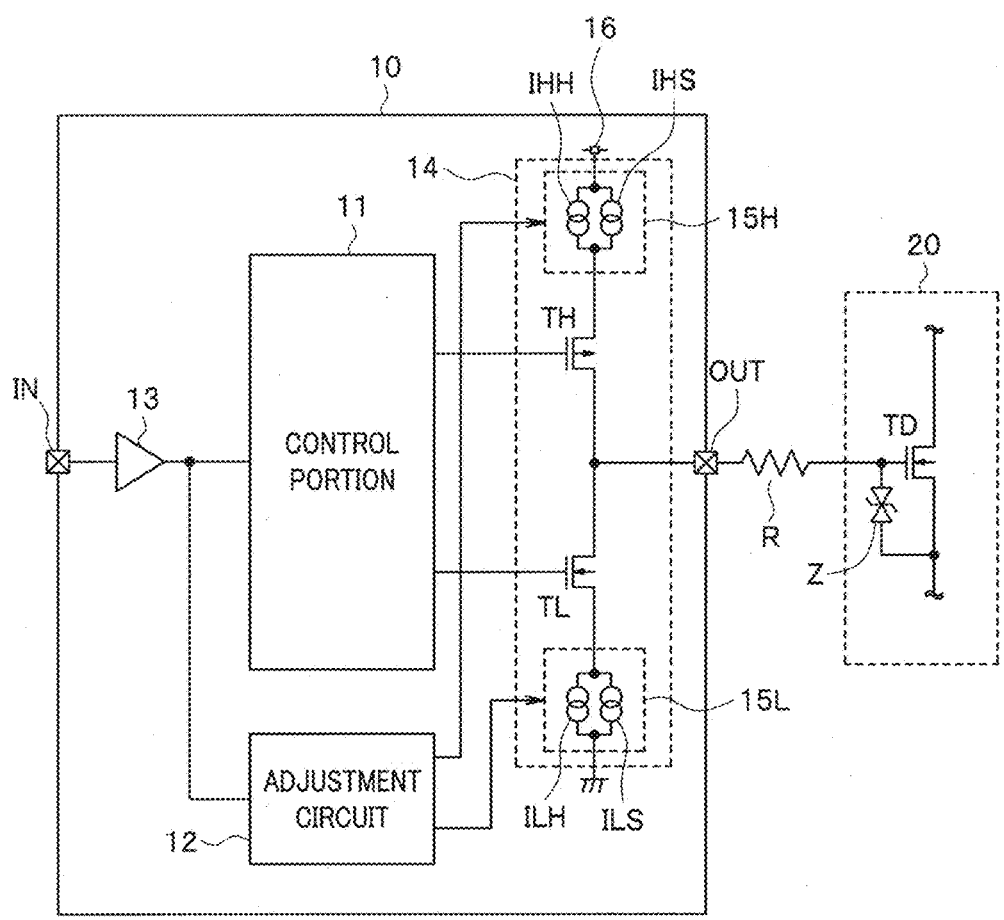
FIG. 1 is a circuit diagram showing a configuration of a driving system which includes a semiconductor integrated circuit according to a first embodiment.

FIG. 1 is a circuit diagram showing a configuration of a driving system which includes a semiconductor integrated circuit according to a first embodiment. In an apparatus of FIG. 1, an FET driving circuit 20, which is a driver for driving a driven part such as a motor not shown, is shown as a control target of a semiconductor integrated circuit 10. The control target, however, is not especially limited. For example, a capacitor charging/discharging circuit, a solenoid circuit or the like may be the control target instead of the FET driving circuit 20.

The semiconductor integrated circuit 10 controls a current which flows out from an output terminal OUT or flows in from the output terminal OUT based on a control signal inputted via an input terminal IN. A control signal is inputted to the input terminal IN from a microcomputer or the like not shown. For example, if the control target is the FET driving circuit 20 for driving a motor or the like as shown in FIG. 1, a PWM control signal for performing on/off control of a transistor TD is inputted as the control signal. Note that the microcomputer may be included in the semiconductor integrated circuit 10.

The FET driving circuit 20, which is the control target, is configured with the transistor TD with a drain-source path connected between a power supply terminal and a reference potential point which are not shown. A gate of the transistor TD is connected to the output terminal OUT of the semiconductor integrated circuit 10 via a resistance R and connected to a source via a Zener diode Z. The transistor TD is adapted to be turned on by a voltage between the gate and the source (a gate voltage) exceeding a predetermined threshold to drive the driven part such as a motor.

The semiconductor integrated circuit 10 includes a control portion 11, an adjustment circuit 12 and an output circuit 14. For example, if the control target is the FET driving circuit 20 as a driver for driving the motor or the like, the output circuit 14 functions as a pre-driver for performing on/off control of the FET driving circuit 20.

The output circuit 14 has a PMOS transistor TH provided on a high side and configured to control outflow of a current to the output terminal OUT and an NMOS transistor TL provided on a low side and configured to control inflow of a current from the output terminal OUT. The control portion 11 generates an on signal or an off signal for performing on/off control of the transistors TH and TL, based on a control signal inputted from the input terminal IN via a buffer 13.

The transistor TH provided on the high side is supplied with the on signal or off signal from the control portion 11 to its gate, and its drain is connected to the output terminal OUT. The transistor TH is turned on by the on signal being supplied to its gate, and supplies a current which flows through a source-drain path to the output terminal OUT.

Further, the transistor TL provided on the low side is supplied with the on signal or off signal from the control portion 11 to its gate, and its drain is connected to the output terminal OUT. The transistor TL is turned on by the on signal being supplied to its gate, and causes a current which flow in from the output terminal OUT to flow via a drain-source path.

In the embodiment, a current source portion 15H is provided between the transistor TH and a power supply terminal 16, and a current source portion 15L is provided between the transistor TL and a reference potential point. The current source portion 15H has current sources IHH and IHS configured to generate a current which is relatively large (hereinafter referred to simply as a large current) and a current which is relatively small (hereinafter referred to simply as a small current), respectively, on the high side. Further, the current source portion 15L has current sources ILH and ILS configured to generate a large current and a small current, respectively, on the low side.

The current source portions 15H and 15L are controlled by the adjustment circuit 12 so that any one of the current sources IHH and IHS operates, and any one of the current sources ILH and ILS operates. In a case where the current sources IHH and ILH operate, a large current flows from the current source IHH to the output terminal. OUT via the transistor TH when the transistor TH is turned on, and a large current flows from the output terminal OUT to the current source ILH via the transistor TL when the transistor TL is turned on. Similarly, in a case where the current sources IHS and ILS operate, a small current flows from the current source IHS to the output terminal OUT via the transistor TH when the transistor TH is turned on, and a small current flows from the output terminal OUT to the current source ILS via the transistor TL when the transistor TL is turned on.

In the embodiment, the large currents generated by the current sources IHH and ILH are set to current values enough to drive the control target, that is, current values making it possible to turn on/off the transistor TD at a high speed so that sufficient performance can be obtained as performance of driving the motor or the like, for example, current values of about several amperes. On the other hand, the small currents generated by the current source IHS and ILS are set to current values which are small enough not to destroy each portion in the semiconductor integrated circuit 10, external parts and the like, for example, current values of about several milliamperes.

The control portion 11 is adapted to generate an on signal and an off signal for turning on one of the transistors TH and TL and turning off the other, and set dead time so that the transistors TH and TL are not turned on at the same time, in order to prevent a through current from flowing in the semiconductor integrated circuit 10. For example, when a PWM pulse is inputted as a control signal, the control portion 11 generates an off signal for turning off the transistors TH and TL at the same time in synchronization with an edge of the PWM pulse, and generates an on signal to one of the transistors TH and TL after elapse of a predetermined time period from the edge of the PWM pulse.

By the way, a conventional semiconductor integrated circuit which includes a pre-driver is provided with neither the adjustment circuit 12 nor the current source portions 15H and 15L. In this case, for example, if a short circuit or a ground fault of the output terminal OUT, a failure of the FET driving circuit 20 or the like occurs, it may happen that a large current continues to flow through a transistor constituting the pre-driver, and there is a risk that obstacles such as destruction of the transistor, destruction of other circuit parts of the IC and a failure of an external part occur. For example, when a ground fault occurs at the output terminal OUT of the semiconductor integrated circuit in the driving system, the abnormality is detected by the system, and L-output control of the pre-driver is performed by microcomputer control. However, depending on a time period after detection of the abnormality until the L-output control is performed via a microcomputer, a large current continues to flow during the period, and there is a possibility that it leads to destruction of the pre-driver or a peripheral circuit. Further, for example, when a sky fault occurs at the output terminal OUT of the semiconductor integrated circuit in the driving system, the abnormality is detected by the system, and L-output control of the pre-driver is performed by microcomputer control. In this case, a large current continues to flow from the output terminal OUT via a low-side transistor of the pre-driver, and there is a possibility that it leads to destruction of the pre-driver or the peripheral circuit.

Figure 2:
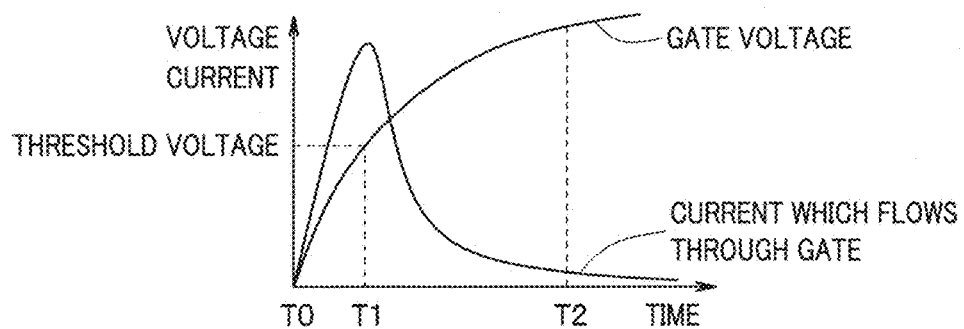
FIG. 2 is a graph showing changes in a gate voltage of a general FET and a current which flows through a gate, in which time is indicated by a horizontal axis, and voltage and current values are indicated by a vertical axis.

FIG. 2 is a graph showing changes in a gate voltage of a general FET and a current which flows through a gate, in which time is indicated by a horizontal axis, and voltage and current values are indicated by a vertical axis. Note that though the adjustment circuit 12 is adapted to switch between the current sources IHH and IHS of the current source portion 15H to cause the current source IHH or IHS to operate in the embodiment, FIG. 2 shows a same characteristic as change in the gate voltage of the transistor TD to be obtained when it is supposed that the adjustment circuit 12 does not perform the switching but causes a large current to continuously flow.

When the transistor TH is turned on at time T0, a large current flows out from the output terminal OUT via the transistor TH and is supplied to the gate of the transistor TD. Thereby, the gate voltage of the transistor TD increases as shown in FIG. 2. When time T1 comes, the gate voltage exceeds a threshold voltage, and the transistor TD is turned on. After that, the gate voltage increases higher but is saturated at a predetermined voltage value.

On the other hand, the current which flows through the gate increases abruptly at and after the time T0, and, after reaching a peak value, decreases abruptly and converges to a sufficiently small current value. Usually, at a time point when the current which flows through the gate converges to the sufficiently small current value, the transistor TD is completely in an on state, and the gate voltage is almost saturated.

On the other hand, in general, if a time period during which a large current flows is sufficiently short, destruction of an element does not occur in a semiconductor integrated circuit even when a fault occurs. Therefore, the adjustment circuit 12 of the embodiment is adapted to switch a current source to be caused to operate in the current source portion 15H from the current source IHH to the current source IHS so that a current which can flow out from the output terminal OUT is restricted to a small current, at predetermined time (hereinafter referred to as H-side current restriction transition time) T2 (for example, 10 microseconds after the high-side transistor TH is turned on) during a time period after a time point when the transistor TD is completely in the on state, and the current which flows through the gate has converged to a sufficiently small current value (for example, 1 microsecond after the high-side transistor TH is turned on) until a time when destruction of an element or the like occurs due to a large current (hereinafter referred to as a resistance-to-destruction time period).

Note that the adjustment circuit 12 may cause the current which flows out from the output terminal OUT not to a small current but to 0. In the FEE driving circuit 20, however, the gate may be provided with a pull-down resistance (not shown) in order to completely turn off the transistor TD. Therefore, when the current supplied to the gate becomes 0, the gate voltage decreases due to the pull-down resistance, and there is a possibility that the transistor TD, which originally should be on, is turned off. Therefore, in the embodiment, a small current is caused to flow after the H-side current restriction transition time.

Further, FIG. 2 shows change in the gate voltage and change in the current which flows through the gate when the transistor TD is on. However, when the transistor TD is off also, similar changes also occur though the changes are different from those in FIG. 2 in polarity. That is, at a time point when the transistor TH is off, and the transistor TL is turned on, the adjustment circuit 12 causes the current source ILH of the current source portion 15L to operate. Thereby, a current flows from the gate of the transistor TD to the transistor TL side via the resistance R and the output terminal OUT. The gate voltage of the transistor TD decreases. When the gate voltage decreases lower than the threshold voltage, and the transistor TD is turned off. After that, the gate voltage decreases lower but converges to a predetermined voltage value. On the other hand, a current which flows from the gate to the output terminal OUT side increases abruptly when and after the transistor TL is turned on, and, after reaching a peak value, decreases abruptly and converges to a sufficiently small current value. Usually, at the time point when the current which flows through the gate converges to a sufficiently small current value, the transistor TD is completely in an off state, and the gate voltage has converged to a predetermined voltage value.

Therefore, the adjustment circuit 12 is adapted to switch the current source to be caused to operate in the current source portion 15L from the current source ILH to the current source ILS so that a current which can flow in from the output terminal OUT is restricted, to a small current, during a sufficiently short predetermined time period (hereinafter referred to as an L-side current restriction transition time period; for example, 10 microseconds) during the resistance-to-destruction time period after the time point when the transistor TD is completely in the off state and the current which flows through the gate has converged to a sufficiently small current.

The adjustment circuit 12 has a timer (not shown) for measuring a time period and a memory (not shown) for storing information about the H-side and L-side current restriction transition time periods, and is adapted to perform switching control of operations of the respective current sources of each of the current source portions 15H and 15L, using information read out from the memory, based on an inputted control signal and time period information from the timer. Note that at least one of the timer and the memory may be provided outside without being provided in the adjustment circuit 12 so that the adjustment circuit 12 may read the time information and the information about the H-side and L-side current restriction transition time periods from the outside.

Figure 3:
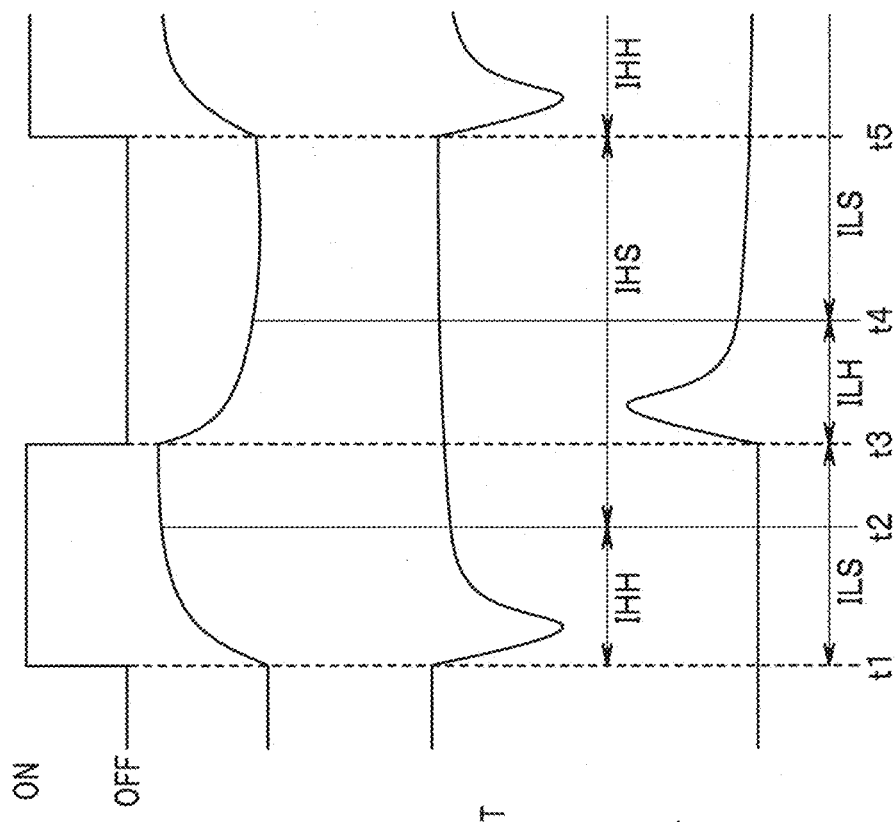
FIGS. 3A to 3D are timing charts for illustrating an operation of the first embodiment.

Next, an operation of the embodiment configured as described above will be described with reference to tinting charts of FIGS. 3A to 3D. In FIGS. 3A to 3D, a dead time period is ignored for simplification of description, and the description will be made on an assumption that the transistor TL is off when the transistor TH is on, and the transistor TL is on when the transistor TH is off. FIG. 3A shows on/off signals supplied to the transistor TH; FIG. 3B shows change in the gate voltage of the transistor TD; FIG. 3C shows change in the current which flows out from the output terminal OUT to the gate of the transistor TD; and FIG. 3D shows change in the current which flows in to the transistor TL side from the gate of the transistor TD via the output terminal OUT. Note that in FIGS. 3A to 3D, a direction of the current which flows out is indicated as negative, and a direction of the current which flows in is indicated as positive.

It is assumed that a control signal for turning on the transistor TD is inputted via the input terminal IN. At time t1, the control portion 11 gives an on signal to the gate of the transistor TH and gives an off signal to the gate of the transistor TL. Further, at the time t1, the adjustment circuit 12 causes the current source portion 15H to cause the current source IHH to operate and causes the current source portion 15L to cause only the current source ILS to operate. The transistors TL and TH are turned off and on, respectively, and a large current from the current source IHH flows out from the output terminal OUT via the transistor TH. The current begins to flow through the gate of the transistor TD, and the gate voltage increases. When the gate voltage exceeds the threshold, the transistor TD is turned on. Thereby, the motor or the like is driven by the FET driving circuit 20. In this case, the large current is supplied to the gate of the transistor TD, the transistor TD is turned on at a high speed, and sufficient driving performance is obtained.

With elapse of a time period, the current Which flows through the gate of the transistor TD decreases. When time t2 at which the H-side current restriction transition time period has elapsed after the time t1 comes, the adjustment circuit 12 causes the operation of the current source IHH to stop and causes only the current source IHS to operate, for the current source portion 15H. Thereby, a small current is supplied from the current source portion 15H. The H-side current restriction transition time period is set to a time period shorter than the resistance-to-destruction time period during which there is a possibility that destruction of an element and the like occurs, and the small current is set to such a small current value that destruction of an element and the like is not caused. Therefore, even when various faults including a sky fault, a ground fault and the like of a terminal have occurred, it does not happen that an element in the semiconductor integrated circuit 10, an external part or the like is destroyed by the current which flows from the current source portion 15H, or that other functions are adversely influenced. Note that, for the current source portion 15H, the adjustment circuit 12 causes only the current source IHS to operate until time t5 when the transistor TH is turned on next.

When time t3 comes, a control signal for causing the transistor TD to be turned on is inputted via the input terminal IN, and the control portion 11 gives an on signal to the gate of the transistor TL and gives an off signal to the gate of the transistor TH at the time t3. Further, at the time t3, the adjustment circuit 12 causes the current source ILH of the current source portion 15L to operate. The transistor TH and the transistor TL are turned off and on, respectively, and a current flows from the gate of the transistor TD to the transistor TL side via the resistance R and the output terminal OUT. The gate voltage of the transistor TD decreases. When the gate voltage becomes smaller than the threshold, the transistor TD is turned off. Thereby, driving of the motor or the like by the FIT driving circuit 20 is stopped. In this case, a large current flows from the gate of the transistor TD to the output terminal OUT side, the transistor TD is turned off at a high speed, and sufficient driving performance is obtained.

Furthermore, as a time period elapses, the current which flows from the gate of the transistor TD to the output terminal OUT side decreases. When time t4 at which the L-side current restriction transition time period has elapsed after the time t3 comes, the adjustment circuit 12 causes the operation of the current source ILH to stop and causes only the current source ILS to operate, for the current source portion 15L. Thereby, a small current is supplied from the current source portion 15L, and a current which flows in from the output terminal OUT to the transistor TL side is restricted. The L-side current restriction transition time period is set to a time period Shorter than the resistance-to-destruction time period during which there is a possibility that destruction of an element and the like occurs, and the small current is set to such a small current value that destruction of an element and the like is not caused. Therefore, even when various faults including a sky fault, a ground fault and the like of a terminal have occurred, it does not happen that an element in the semiconductor integrated circuit 10, an external part or the like is destroyed by a current which flows in toward the current source portion 15L, or that other functions are adversely influenced. Note that, for the current source portion 15L, the adjustment circuit 12 causes only the current source ILS to operate until time when the transistor TL is turned on next.

After that, a similar operation is repeated. Thus, a sufficient driving characteristic is Obtained by causing a large current to flow immediately after start of turning-on of the transistors TH and TL to turn on/off the transistor TD at a high speed. Further, after the transistor TD is turned on/off, the large current is switched to a small current before the resistance-to-destruction time period elapses. Thereby, it is possible to, even at time of a fault, including a sky fault, a ground fault and the like, prevent an element and the like from being destroyed by the large current while maintaining the sufficient driving characteristic of the transistor TD.

Thus, in the embodiment, a large current by which a control target can obtain a sufficient driving characteristic is caused to flow to an output terminal; a period during which the large current is caused to flow is restricted to the current restriction transition time period; and, after that, such a small current that an element is not destroyed is caused to flow to the output terminal. Thereby, it is possible to, during a normal time period, drive the control target in a manner that the sufficient driving characteristic is obtained, and it is possible to, even at the time of a fault, including a sky fault, a ground fault and the like, prevent an element in the semiconductor integrated circuit, an external part or the like from being destroyed and prevent other functions from being adversely influenced.

Note that values of a time period required for turning on the FET and the resistance-to-destruction time period are determined for each element, and the H-side and L-side current restriction transition time periods can be appropriately set according to the values.

Second Embodiment

Figure 4:
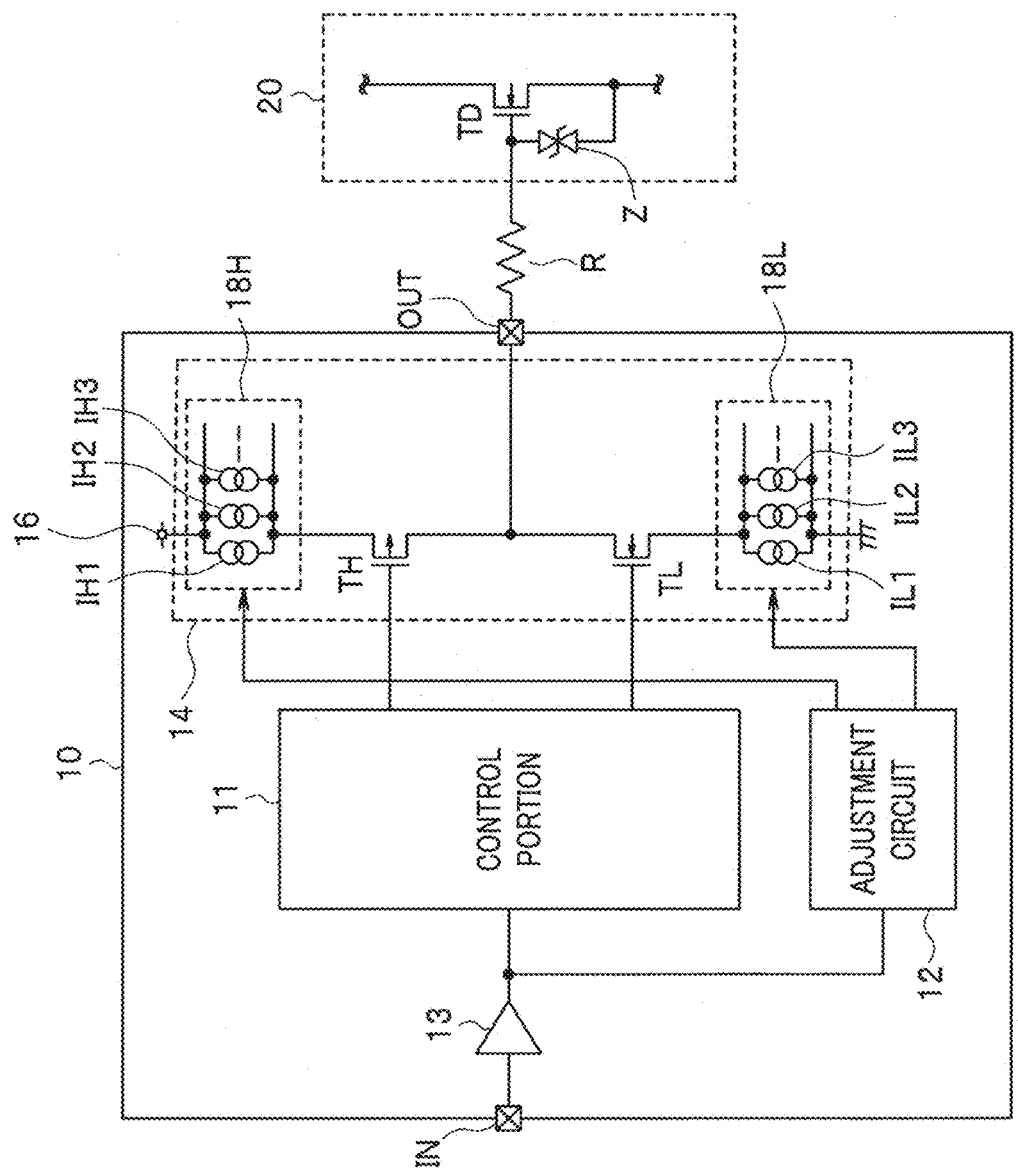
FIG. 4 is a circuit diagram showing a second embodiment.

FIG. 4 is a circuit diagram showing a second embodiment. In FIG. 4, same components as those in FIG. 1 are given same reference numerals, and description of the components will be omitted.

The second embodiment is different from the first embodiment in a point that current source portions 18H and 18L are adopted instead of the current source portions 15H and 15L, respectively. The current source portion 18H has n current sources IH1, IH2, . . . , IHn, and the current sources IH1, IH2, . . . , IHn generate currents ih1, ih2, . . . , ihn respectively. The current ih1 generated by the current source IH1 is a large current, and the currents ih1, ih2, ih3, . . . have a relationship of ih1>ih2>ih3> . . . . Further, the current urn generated by the current source IHn is a small current. Similarly, the current source portion 18L has n current sources IL1, IL2, . . . , ILn, and the current sources IL1, IL2, . . . , ILn generate currents il1, il2, . . . , iln, respectively. The current il1 generated by the current source IL1 is a large current, and the currents il1, i12, i13, . . . have a relationship of il1>il2>il3> . . . . Further, the current un generated by the current source ILn is a small current.

The adjustment circuit 12 controls the current source portions 18H and 18L to switch the current source to be caused to operate. The adjustment circuit 12 is adapted to cause the current source IH1 to generate a large current at a timing of turning on the transistor TD, and sequentially switch the current source to be caused to operate, in order of IH2, IH3, . . . as time elapses until the current source IHn is caused to generate a small current when the H-side current restriction transition time period elapses. Similarly, the adjustment circuit 12 is adapted to cause the current source IL1 to generate a large current at a timing attuning off the transistor TD, and sequentially switch the current source to be caused to operate, in order of IL2, IL3, . . . as time elapses until the current source ILn is caused to generate a small current when the L-side current restriction transition time period elapses.

Figure 5:
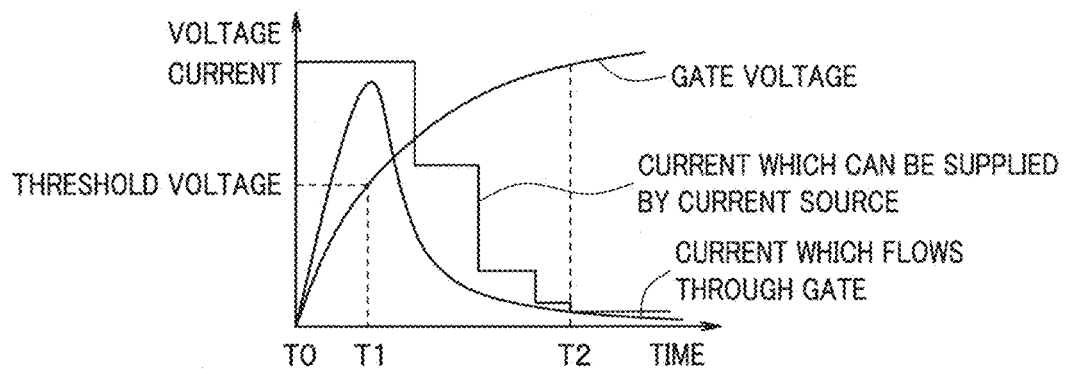
FIG. 5 is a graph for illustrating switching of current sources of a current source portion 18H, in which a way of display similar to that of FIG. 2 is adopted.

FIG. 5 is a graph fin illustrating switching of current sources of a current source portion 18H, in Which a way of display similar to that of FIG. 2 is adopted. FIG. 5 shows an example in a case of n=5. The adjustment circuit 12 causes the current source IH1 to operate during a period from the time T0 until the current which flows through the gate exceeds a peak; switches sequentially to the current sources IH2 to IH4 during a period until the H-side current restriction transition time T2; and switches to the current source IH5 when the H-side current restriction transition time T2 comes. Then, the adjustment circuit 12 causes an operation of the current source IH5 to continue until the transistor TH is turned on next.

For the current source portion 18L also, the adjustment circuit 12 performs similar control. That is, the adjustment circuit 12 causes the current source IL1 to operate during a period from when the transistor TL is turned on until the current which flows through the gate exceeds a peak; switches sequentially to the current sources IL2 . . . during a period until the L-side current restriction transition time; and switches to the current source ILn when the L-side current restriction transition time comes. Then, the adjustment circuit 12 causes an operation of the current source ILn to continue until the transistor TL is turned on next.

Note that the H-side and L-side current restriction transition times and a timing of switching each current source of the current source portions 18H and 18L can be determined for each element, and it is assumed that switching timing information used by the adjustment circuit 12 is stored in the memory not shown.

In the embodiment configured as described above, a substantially same operation as the first embodiment is performed. There may be a case where the gate voltage slightly decreases at time of switching from the current source IHH to the current source IHS, though it is not shown in FIGS. 3A to 3D showing the first embodiment. This is caused by a voltage drop of the resistance R. By a current decreasing significantly, change in voltages at both ends of the resistance R increases, and the gate voltage is influenced.

In comparison, in the second embodiment, since amounts of current of the current source portions 18H and 18L change little by little, an amount of change in the gate voltage is also small. As a result, the gate voltage changes smoothly.

Thus, in the embodiment, an effect similar to that of the first embodiment is obtained, and an effect of making it possible to smooth the change in the gate voltage is obtained.

Third Embodiment

Figure 6:
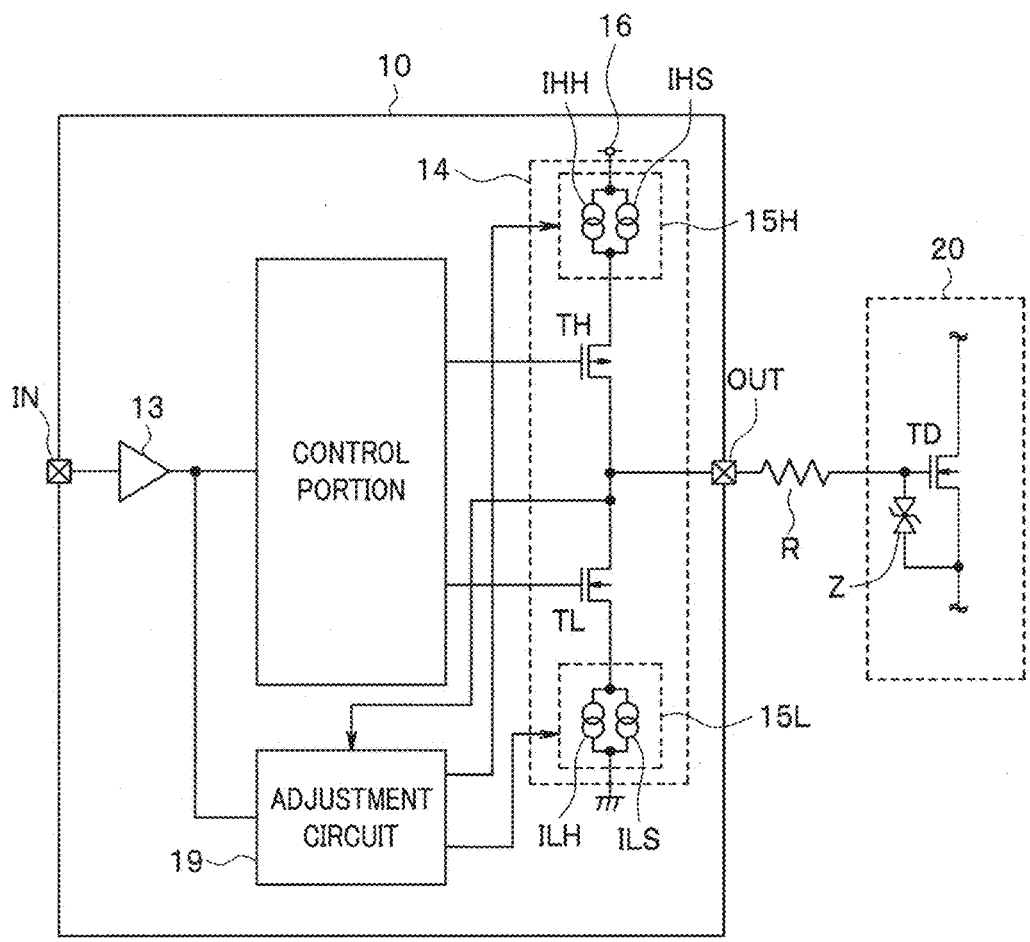
FIG. 6 is a circuit diagram showing a third embodiment.

FIG. 6 is a circuit diagram showing a third embodiment. In FIG. 6, same components as those in FIG. 1 are given same reference numerals, and description of the components will be omitted.

In the first and second embodiments, switching of each current source of the current source portions 15H, 15L, 18H and 18L is performed in synchronization with an on signal of the transistor TH or TL respectively. The adjustment circuit 12 switches each current source at a switching timing corresponding to elapse of a predetermined time period from a timing of starting to turn on the transistors TH and based on the timing of starting to turn on the transistors TH and TL. In this case, it is necessary to determine information about the H-side and L-side current restriction transition time periods for each element so that the information is available in the adjustment circuit 12. In comparison, in the third embodiment, the switching timing is determined by monitoring at least one of the voltage and current of the output terminal OUT, to control each of the current source portion 15H and 15L.

As shown by waveforms in FIGS. 3A to 3D, the gate voltage of the transistor TD and the current which flows through the gate change in predetermined forms. When a sky fault, a ground fault or various faults occur, the waveforms of the gate voltage and the current which flows the gate become waveforms different from the assumed waveforms shown in FIGS. 3A to 3D.

An adjustment circuit 19 is given a control signal from the buffer 13 and is connected to the output terminal OUT to detect at least one of the voltage and current of the output terminal OUT. The adjustment circuit 19 monitors at least one of the voltage and current of the output terminal OUT after a predetermined time period from rising and falling edges of a control signal. The adjustment circuit 19 causes the current sources IHH and ILH to operate at a time point when the transistors TH and TL are turned on, and causes the current sources IHH and ILH to stop and causes the current sources IHS and ILS to operate when the voltage or current of the output terminal OUT comes within a predetermined voltage range or current range. That is, the adjustment circuit 19 can detect the H-side and L-side current restriction transition times according to the voltage or current of the output terminal OUT and switch to the current sources IHS and ILS for a small current.

In the embodiment configured as described above, switching control of each current source of the current source portions 15H and 15L is performed based on at least one of the voltage and current of the output terminal OUT. The adjustment circuit 19 causes the current source IHH to operate at the timing of the transistor TH being turned on by a control signal, and causes the current source ILH to operate at the timing of the transistor TL being turned on. Thereby, the transistor TD is turned on/off at a high speed, and a sufficient driving characteristic can be obtained.

The adjustment circuit 19 monitors at least one of the voltage and current of the output terminal OUT after a predetermined time period after the transistors TH and TL are turned on. The gate voltage of the transistor TD and the current which flows through the gate have predetermined characteristics as shown in FIGS. 3A to 3D. The adjustment circuit 19 can judge times corresponding to the H-side and L-side current restriction transition times in the first embodiment by monitoring at least one of the voltage and current of the output terminal OUT after the predetermined time period after the transistors TH and TL are turned on.

When the voltage and current of the output terminal OUT which the adjustment circuit 19 monitors reach values within the assumed voltage and current ranges, the adjustment circuit 19 judges that time corresponding to the H-side or L-side current restriction transition time is reached, causes the current sources IHH and ILH to stop and causes the current sources IHS and ILS to operate. Thereby, even when a sky fault, a ground fault, various faults and the like have occurred, the time period during which a large current flows is sufficiently short, and destruction of an element and the like does not occur. Further, since a small current flows after switching of a current source even when a sky fault, a ground fault, various faults and the like have occurred, it is possible to prevent destruction of an element and the like.

Thus, in the embodiment, it is possible to, even at the time of a fault, including a sky fault, a ground fault and the like, prevent an element in the semiconductor integrated circuit, an external part or the like from being destroyed and prevent other functions from being adversely influenced; similarly to the first embodiment. Further, in the third embodiment, it is not necessary to determine information about the switching timing of the current sources in advance, and operation is easy.

Fourth Embodiment

Figure 7:
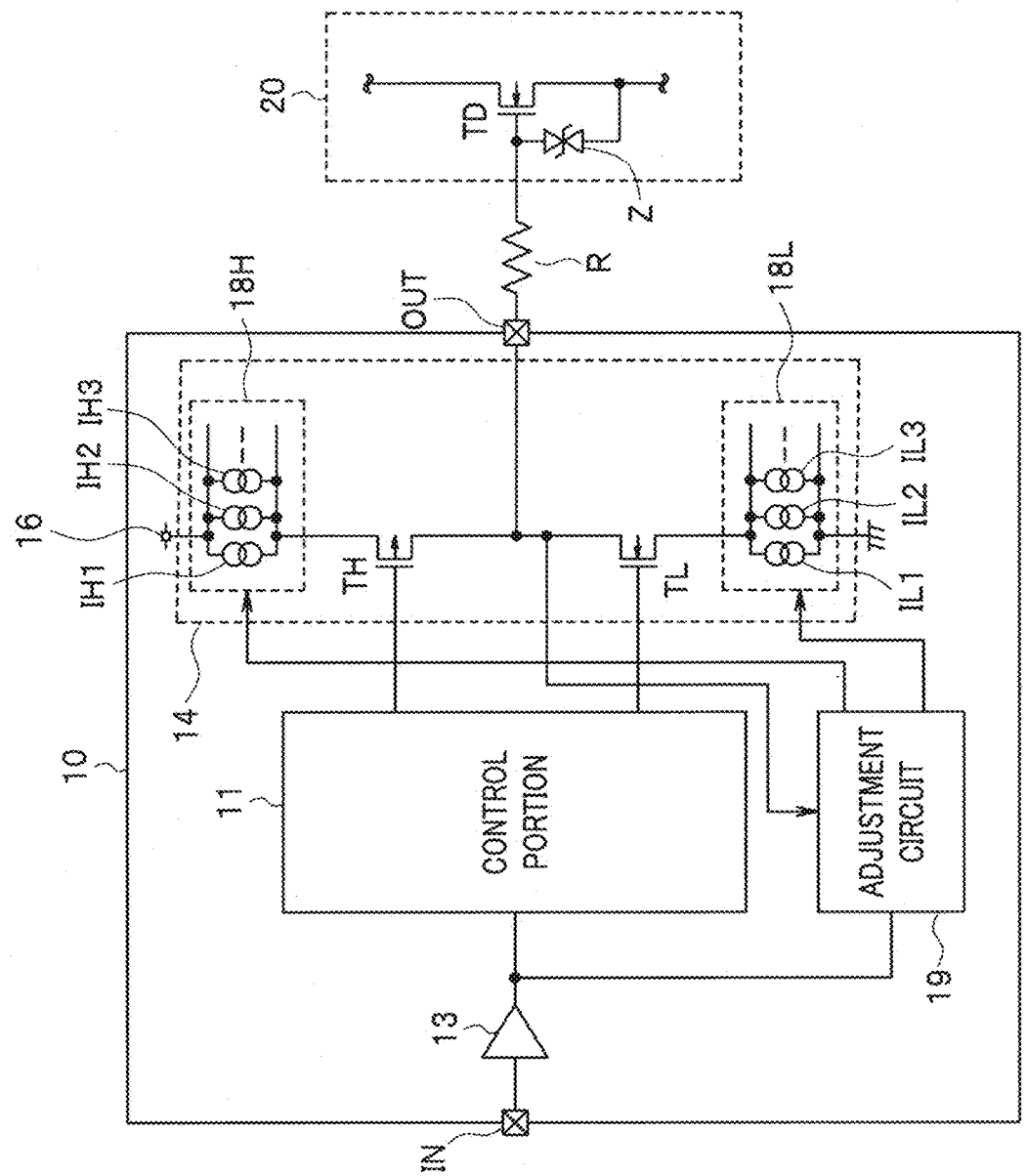
FIG. 7 is a circuit diagram showing a fourth embodiment.

FIG. 7 is a circuit diagram showing a fourth embodiment. In FIG. 7, same components as those in FIG. 5 or 6 are given same reference numerals, and description of the components will be omitted.

The fourth embodiment is different from the third embodiment only in the point that current source portions 18H and 18L are adopted instead of the current source portions 15H and 15L, respectively. A configuration of the current source portion 18H and 18L is similar to that of the second embodiment. The fourth embodiment is different only in a point that the adjustment circuit 19 determines the switching timing in FIG. 5 by monitoring at least one of the voltage and current of the output terminal OUT. That is, the adjustment circuit 19 determines the switching timing of the current sources from a monitoring result of at least one of the voltage and current of the output terminal OUT.

Other components, operation and effects are similar to those of the third embodiment.

Thus, in the embodiment, an effect similar to that of the third embodiment is obtained, and an effect of making it possible to smooth the change in the gate voltage is obtained.

Fifth Embodiment

Figure 8:
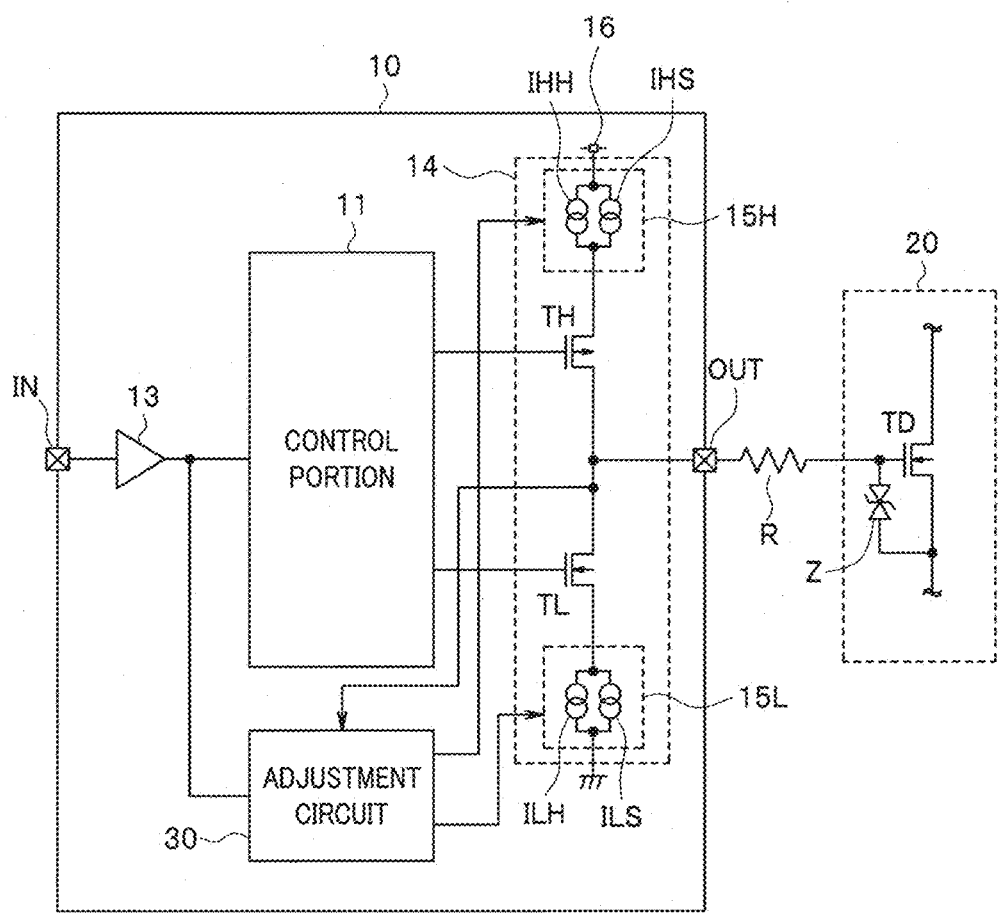
FIG. 8 is a circuit diagram showing a fifth embodiment.

FIG. 8 is a circuit diagram showing a fifth embodiment. In FIG. 8, same components as those in FIG. 1 are given same reference numerals, and description of the components will be omitted.

In the first and second embodiments, switching of each current source of the current source portions 15H, 15L, 18H and 18L is performed in synchronization with the transistor TH or TL being turned on/off. The adjustment circuit 12 switches each current source at a switching timing corresponding to elapse of a predetermined time period from a timing of starting to turn on the transistors TH and TL, based on the timing of starting to turn, on the transistors TH and TL. In this case, it is necessary to determine information about the H-side and L-side current restriction transition time periods for each element so that the information is available in the adjustment circuit 12. In comparison, in the fifth embodiment, the switching timing is determined by monitoring at least one of the voltage and current of the output terminal OUT at a predetermined time timing in synchronization with the transistors TH and TL being turned on, to control each of the current source portion 15H and 15L.

As shown by waveforms in FIGS. 3A to 3D, the gate voltage of the transistor TD and the current which flows through the gate change in predetermined forms. When a sky fault, a ground fault or various faults occur, the waveforms of the gate voltage and the current which flows the gate become waveforms different from the assumed waveforms shown in FIGS. 3A to 3D.

An adjustment circuit 30 is given a control signal from the buffer 13 and is connected to the output terminal OUT to detect at least one of the voltage and current of the output terminal OUT. The adjustment circuit 30 monitors at least one of the voltage and current of the output terminal OUT after a predetermined time period from rising and falling edges of a control signal. The adjustment circuit 30 causes the current sources IHH and ILH to operate during a normal time period; and, when the voltage or current of the output terminal OUT goes outside a predetermined voltage range or current range, the adjustment circuit 30 causes the current sources IHH and ILH to stop, causes the current sources IHS and ILS to operate, and, after that, causes only the current sources IHS and ILS to operate.

In the embodiment configured as described above, switching control of each current source of the current source portions 15H and 15L is performed based on at least one of the voltage and current of the output terminal OUT. The adjustment circuit 30 monitors at least one of the voltage and current of the output terminal OUT after a predetermined time period from an edge of a control signal. If the voltage and current of the output terminal OUT being monitored are values within the assumed voltage range and current range, the adjustment circuit 30 judges that a sky fault, a ground fault or various faults have not occurred and causes the current sources IHH and ILH to operate. Thereby, it is possible to cause the transistor TD to be turned on and off at a high speed and obtain a sufficient driving capability.

On the other hand, if the voltage and current of the output terminal OUT being monitored become values outside the assumed voltage range and current range, the adjustment circuit 30 judges that a sky fault, a ground fault or various faults have occurred, and causes the current sources IHH and ILH to stop and the current sources IHS and ILS to operate. Thereby, it is possible to, even at the time of a fault, including a sky fault, a ground fault and the like, prevent an element in the semiconductor integrated circuit, an external part or the like from being destroyed and prevent other functions from being adversely influenced.

Thus, in the embodiment, it is possible to, even at the time of a fault, including a sky fault, a ground fault and the like, prevent an element in the semiconductor integrated circuit, an external part or the like from being destroyed and prevent other functions from being adversely influenced, similarly to the first embodiment. Further, in the fifth embodiment, it is not necessary to determine information about the switching timing of the current sources in advance, and operation is easy.

Modification

Figure 9:
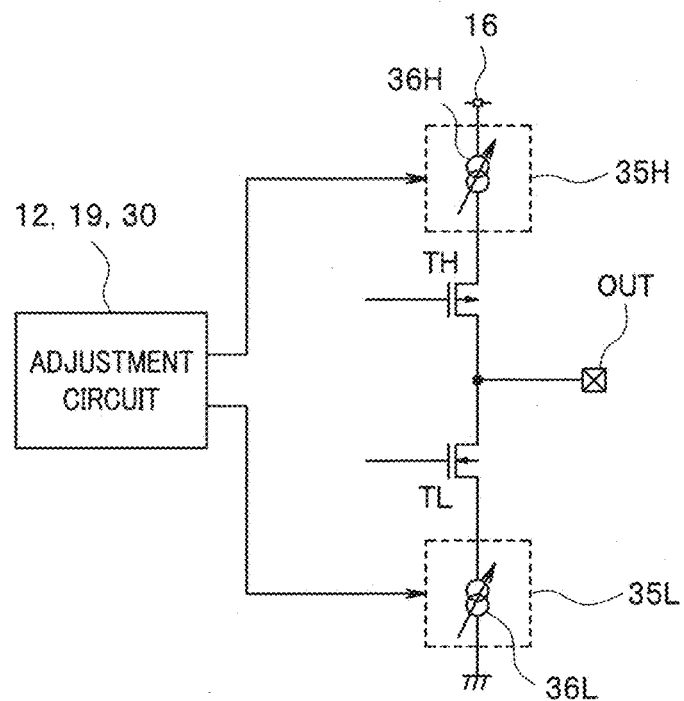
FIG. 9 is a circuit diagram showing a modification of current source portions 15H and 15L, or 18H and 18L.
Figure 10:
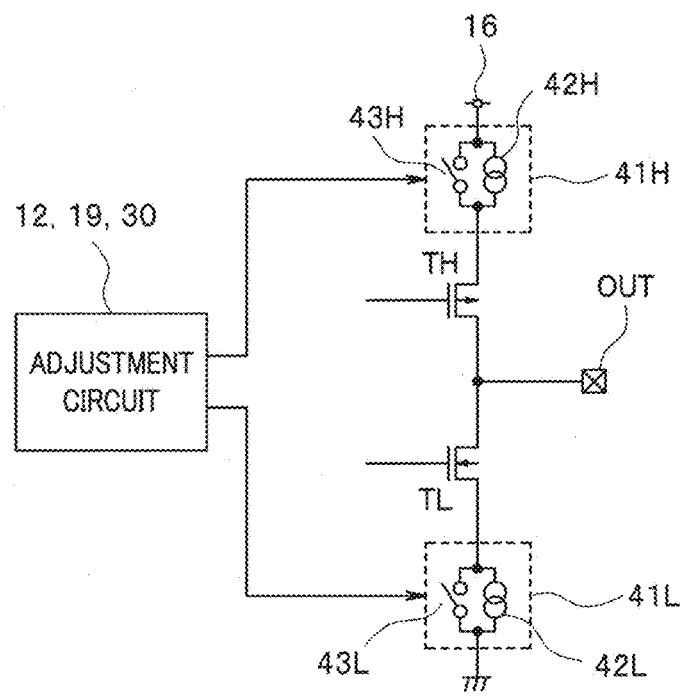
FIG. 10 is a circuit diagram showing a modification of the current source portions 15H and 15L, or 18H and 18L.

FIGS. 9 and 10 are circuit diagrams showing modifications of the current source portions 15H and 15L, or 18H and 18L.

Current source portions 35H and 35L are provided with variable current sources 36H and 36L, respectively. The variable current source 36H is connected between the power supply terminal 16 and a source of the transistor TH and is adapted to be capable of generating a variable current by being controlled by the adjustment circuit 12, 19 or 30. Similarly, the variable current source 36L is connected between the reference potential point and a source of the transistor TL and is adapted to be capable of generating a variable current by being controlled by the adjustment circuit 12, 19 or 30. That is, the variable current sources 36H and 36L cause a large current to flow after the transistors TH and TL are turned on and cause a small current to flow after the H-side and L-side current restriction transition time periods elapse. It is also possible to switch the current value in stages as in the embodiment 2 or 4.

Further, a current source portion 41H in FIG. 10 is configured with a current source 42H and a switch 43H, and a current source portion 41L is configured with a current source 42L and a switch 43L. The current source 42H is adapted to be capable of generating the small current described above or the currents ih2, ih3, . . . by being controlled by the adjustment circuit 12, 19 or 30. The switch 43H is adapted to be capable of, when being turned on by being controlled by the adjustment circuit 12, 19 or 30, causing a large current to flow from the power supply terminal 16 to the output terminal OUT via the transistor TH.

Further, the current source 42L is adapted to be capable of generating the small current described above or the currents il2, il3, . . . by being controlled by the adjustment circuit 12, 19 or 30. The switch 43L is adapted to be capable of, when being turned on by being controlled by the adjustment circuit 12, 19 or 30, causing a large current to flow from the output terminal OUT to the reference potential point via the transistor TL.

Thus, by adopting the current source portions of FIGS. 9 and 10 also, each of the embodiments can be realized.

Note that the present invention is not limited to the above embodiments and can be variously modified at an implementation stage within a range not departing from the spirit of the invention. Further, the above embodiments include inventions at various stages, and various inventions can be extracted from appropriate combinations of a plurality of disclosed components. For example, even if some constituent features are deleted from all constituent features shown in an embodiment, a configuration obtained after deleting the constituent features can be extracted as an invention if the problem stated in the section of the problem to be solved by the invention can be solved, and the advantageous effects stated in the section of the advantageous effects of the invention can be obtained.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor integrated circuit comprising:
an output circuit configured to cause a current to flow out from a power supply terminal to a control target via an output terminal or cause a current to flow in from the control target to a reference potential point via the output terminal, based on a control signal;
a first current source portion provided for the output circuit between the power supply terminal and the output terminal and configured to be capable of switching a current suppliable to the output terminal;
a second current source portion provided for the output circuit between the output terminal and the reference potential point and configured to be capable of switching a current capable of flowing in from the output terminal; and
an adjustment circuit configured to switch a current that the first current source portion is caused to generate and a current that the second current source portion is caused to generate, based on the control signal.

2. The semiconductor integrated circuit according to claim 1, wherein the adjustment circuit switches the current that the first current source portion and the second current source portion are caused to generate, at an interval of a predetermined time period based on a timing based on the control signal.

3. The semiconductor integrated circuit according to claim 2, wherein the adjustment circuit causes the first current source portion to generate a first current after a start time of starting to cause the current to flow out from the output terminal until a first time period elapses, and causes the first current source portion to generate a second current smaller than the first current when the first time period elapses, and the adjustment circuit causes the second current source portion to generate the first current after a start time of starting to cause the current to flow in from the output terminal until a second time period elapses, and causes the second current source portion to generate the second current when the second time period elapses.

4. The semiconductor integrated circuit according to claim 2, wherein the adjustment circuit causes the first current source portion to generate a first current after a start time of starting to cause the current to flow out from the output terminal for the predetermined time period, causes the current generated by the first current source portion to decrease from the first current in stages after elapse of the predetermined time period until a first time period elapses after the start time, and causes the first current source portion to generate a further decreased second current when the first time period elapses, and the adjustment circuit causes the second current source portion to generate the first current after a start time of starting to cause the current to flow in from the output terminal for the predetermined time period, causes the current generated by the second current source portion to decrease from the first current in stages after elapse of the predetermined time period until a second time period elapses after the start time, and causes the second current source portion to generate the further decreased second current when the second time period elapses.

5. The semiconductor integrated circuit according to claim 3, wherein the first time period is set to a time period during which destruction of an element does not occur.

6. The semiconductor integrated circuit according to claim 5, wherein
the control target is an FET; and
the first time period is set to a time period until after a current that flows through a gate of the FET reaches a peak after the FET transitions from off to on, or on to off.

7. The semiconductor integrated circuit according to claim 6, wherein the first time period is set to a time period which is longer than a time period during which a current enough for the FET to transition from off to on flows or a time period during which a current enough for the FET to transition from on to off flows, and in which destruction of an element does not occur.

8. The semiconductor integrated circuit according to claim 3, wherein the second current is set to a current value at which destruction of an element does not occur.

9. The semiconductor integrated circuit according to claim 2, wherein after the current that flows out or flows in via the output terminal converges, the adjustment circuit switches the current to a second current smaller than a first current before a resistance-to-destruction time period elapses from a timing based on the control signal, the resistance-to destruction time period being a time period until an element consisting the output circuit is destroyed in a case where the first current is supplied to the output circuit.

10. The semiconductor integrated circuit according to claim 1, wherein the first current source portion and the second current source portion are configured with a plurality of current sources that are different in a suppliable current.

11. The semiconductor integrated circuit according to claim 1, wherein the output circuit controls current outflow to the output terminal by a high-side transistor and controls current inflow from the output terminal by a low-side transistor.

12. The semiconductor integrated circuit according to claim 1, wherein the adjustment circuit switches the current that the first current source portion is caused to generate and the current that the second current source portion is caused to generate, according to a voltage of the output terminal and a current that flows through the output terminal.

13. The semiconductor integrated circuit according to claim 12, wherein the adjustment circuit causes the first current source portion to generate a first current at a start time of starting to cause the current to flow out from the output terminal, and causes the first current source portion to generate a second current smaller than the first current when a result of detection of at least one of a voltage that appears in the output terminal and a current that flows through the output terminal reaches a predetermined range, and the adjustment circuit causes the second current source portion to generate the first current at a start time of starting to cause the current to flow in from the output terminal, and causes the second current source portion to generate the second current smaller than the first current when the result of detection of at least one of the voltage that appears in the output terminal and the current that flow through the output terminal reaches a predetermined range.

14. The semiconductor integrated circuit according to claim 12, wherein the adjustment circuit causes the first current source portion to generate a first current during a normal time period, and causes the first current source portion to generate a second current smaller than the first current when a result of detection of at least one of a voltage that appears in the output terminal and a current that flows through the output terminal after a predetermined time period after a start time of starting to cause the current to flow out from the output terminal goes outside a predetermined range, and the adjustment circuit causes the second current source portion to generate the first current during the normal time period, and causes the second current source portion to generate the second current smaller than the first current when the result of detection of at least one of the voltage that appears in the output terminal and the current that flows through the output terminal after a predetermined time period after a start time of starting to cause the current to flow in from the output terminal goes outside a predetermined range.

15. The semiconductor integrated circuit according to claim 1, comprising at least one of a voltage monitor configured to detect a voltage that appears in the output terminal and a current monitor configured to detect a current that flows through the output terminal.

16. A semiconductor integrated circuit comprising:
first and second transistors whose main current paths are connected in series, the first and second transistors being configured to be complementarily on/off-controlled according to a control signal;
a first variable current source connected to one of the main current paths of the first transistor; and
a second variable current source connected to one of the main current paths of the second transistor; wherein
the first or second variable current source causes a first current to flow when on-control of the first or second transistor is started according to the control signal, and causes a second current smaller than the first current when a predetermined time period elapses after the on-control is started.

* * * * *